United States Patent [19]

Stitzer et al.

[11] 4,155,053
[45] May 15, 1979

[54] ENHANCED COUPLING IN FERRIMAGNETIC MICROWAVE DEVICES

[75] Inventors: Steven N. Stitzer, Glen Burnie; Harry Goldie, Randallstown, both of Md.

[73] Assignee: Westinghouse Electric Corp., Pittsburgh, Pa.

[21] Appl. No.: 811,920

[22] Filed: Jun. 30, 1977

[51] Int. Cl.² ........................... H01P 1/20; H01P 1/22
[52] U.S. Cl. ................ 333/17 L; 333/24.1; 333/204
[58] Field of Search .............. 333/24.1, 24.2, 17 L, 333/73 S, 82 R, 82 B, 73 R

[56] References Cited
U.S. PATENT DOCUMENTS 3,740,675  6/1973  Moore et al. ................ 333/73 R

*Primary Examiner*—Paul L. Gensler
*Attorney, Agent, or Firm*—R. M. Trepp

[57] ABSTRACT

An improved microwave device for filtering and power limiting is described incorporating a yttrium-iron-garnet (YIG) sphere and a transmission line wherein coupling between the YIG sphere and the transmission line is enhanced by placing the YIG sphere in a groove in a ground plane under the transmission line. The current induced in the groove of the ground plane results in enhanced coupling.

16 Claims, 8 Drawing Figures

ENHANCED COUPLING IN FERRIMAGNETIC MICROWAVE DEVICES

GOVERNMENT CONTRACT

The invention herein described was made in the course of or under a contract or subcontract thereunder with the Department of the Air Force.

BACKGROUND OF THE INVENTION

1. Field of the Invention:

This invention relates to microwave devices, particularly to microwave filters and power limiters.

2. Description of the Prior Art:

In the prior art magnetic coupling between a YIG sphere and a transmission line to form a microwave filter or power limiter was accomplished by physically placing the YIG sphere in close proximity to the transmission line or between conductors of the transmission line. For example, for relatively light magnetic coupling, the YIG sphere may be placed between a straight transmission line and a ground plane. For large YIG spheres, the YIG sphere diameter may exceed the spacing between the transmission line and the ground plane. In such a case, additional space may be provided by forming a recess including a dimple for accepting the protrusion of the YIG sphere as described in U.S. Pat. No. 3,740,675 issued on June 19, 1973 and assigned to the assignee herein.

For tighter magnetic coupling, it has been common practice to form an arc or loop in the transmission line over the sphere with a ground plane below. The loop in the transmission line increases the inductance in the sphere region which helps to concentrate the radio frequency magnetic field. The loop in the transmission line, however, is very difficult to form and install over the YIG sphere at microwave frequencies such as X band because of its small size. The use of very small spheres within the range available increases the difficulty of installing the top conductor having a loop over the sphere.

It is therefore desirable to provide tight magnetic coupling between a transmission line and a YIG sphere, large or small, by a readily fabricated structure.

It is furthermore desirable to provide tight magnetic coupling between a transmission line and a plurality of YIG spheres by a readily fabricated structure.

SUMMARY OF THE INVENTION

In accordance with the present invention, a method and apparatus is provided for enhancing the magnetic coupling between a transmission line and a YIG sphere comprising a ground plane having a groove, the YIG sphere positioned in the groove of the ground plane, the transmission line positioned over the ground plane and the YIG sphere and means for supporting and spacing the transmission line from the ground plane and the YIG sphere.

The invention further provides apparatus for enhancing the magnetic coupling between a transmission line and first and second YIG spheres comprising first and second spaced apart ground planes each having a first surface facing one another and having a groove in each first surface positioned opposite one another, the first YIG sphere positioned in the groove of the first ground plane, the second YIG sphere positioned in the groove of the second ground plane, the transmission line positioned between the first and second YIG spheres, and means for supporting and spacing the transmission line between the first and second ground planes.

The invention further provides a method for enhancing the magnetic coupling between a transmission line comprising a conductor and a ground plane and a YIG sphere comprising the steps of forming a groove in the ground plane, positioning the YIG sphere in the groove and positioning the conductor over the ground plane and YIG sphere at a predetermined spacing.

DESCRIPTION OF THE PREFERRED EMBODIMENTS

Figure 1:
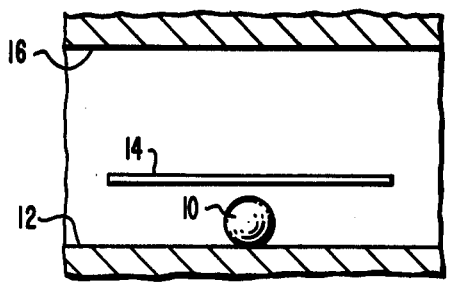
FIGS. 1 and 2 show two prior art transmission line and YIG sphere coupling arrangements.
Figure 2:
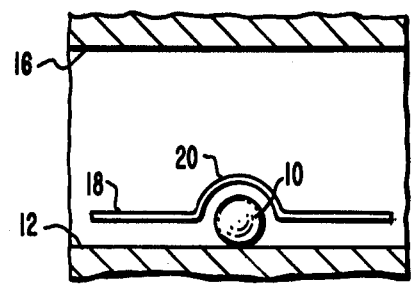

FIGS. 1 and 2 show prior art arrangements for coupling a ferrimagnetic material such as a YIG sphere to a transmission line. In FIG. 1, YIG sphere 10 is positioned between ground plane 12 and transmission line 14. Above transmission line 14 is ground plane 16. FIG. 2 shows a transmission line which is shaped in a loop to conform with the surface of YIG sphere 10 to increase the magnetic coupling between the two. In FIG. 2 like references are used for the functions corresponding to the apparatus of FIG. 1. YIG sphere 10 is placed between ground plane 12 and transmission line 18 having a loop or arc 20 so that the transmission line 18 will fit closely to YIG sphere 10. Transmission lines 14 and 18 (FIGS. 1 and 2) may, for example, be rectangular in shape having a height such as shown in FIGS. 1 and 2 sufficient to support itself and having a width less than the radius of the YIG sphere 10.

Figure 3:
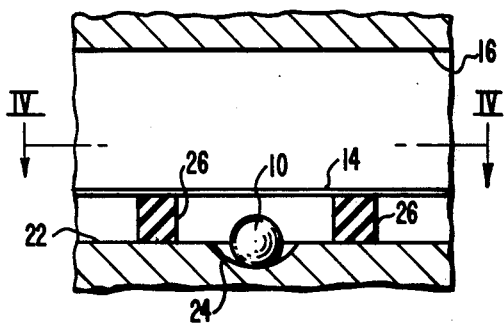
FIG. 3 is a cross-section view of one embodiment of the invention.
Figure 4:
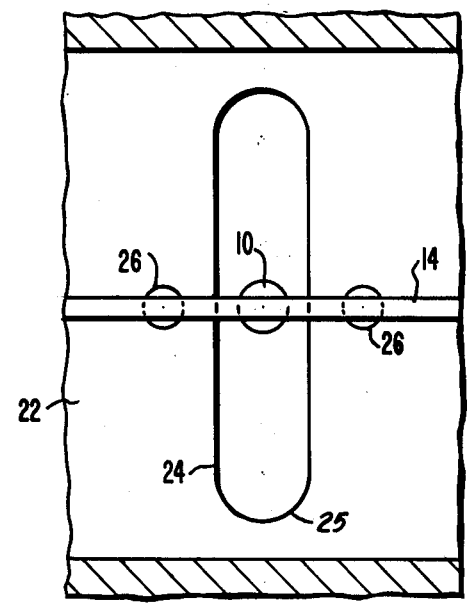
FIG. 4 is a cross-section of the embodiment in FIG. 3 along the lines IV—IV.

FIG. 3 is a cross-section view of one embodiment of the invention for enhancing the magnetic coupling between a transmission line and a YIG sphere. In FIG. 3 like references are used for functions corresponding to the apparatus of FIG. 1. Ground plane 22 has a groove, slot or depression 24 which extends between groove ends 23 and 25, its length, as shown in FIG. 4. Groove 24 may be of arbitrary cross-section. For example, groove 24 may be semi-circular with a radius equal to the radius of sphere 10. Groove 24 is formed transverse to the transmission line 14 and for best results should be orthogonal to transmission line 14 such as within ±1 degree. A sphere of ferrimagnetic material such as yttrium-iron-garnet is positioned in the groove 24 of the ground plane 22. A transmission line 14 is positioned over the ground plane 22 and the YIG sphere 10. Spacers 26 provide a means for supporting and spacing the transmission line 14 from the ground plane 22 and YIG sphere 10. Spacers 26 may be made from a non-conducting or insulating material. In the operation of the embodiment in FIGS. 3 and 4 a radio frequency current is induced on transmission line 14. An equal and opposite current is induced in ground plane 22. The equivalent of the loop 20 in the transmission line 18 of FIG. 2 is obtained by placing the groove 24 (FIGS. 3 and 4) in ground plane 22. The groove 24 facilitates close magnetic coupling between the currents in the ground plane 22 and the YIG sphere 10. If desired, a loop such as loop 20 in FIG. 2 may be formed in transmission line 14 of FIGS. 3 and 4 to obtain even greater magnetic coupling between transmission line 14 and YIG sphere 10. The groove 24 in ground plane 22 is much easier to form or fabricate consistently since the groove may be machined out of a solid piece of the ground plane such as a metal plate. While sharp bends formed in the transmission line 14 may result in increased losses in RF energy, a long groove transverse to the transmission line 14 provides an inherently lower loss path for the radio frequency image current. In addition, if heat sinking of the YIG sphere is required, such as in a power limiter, the diameter of the groove or cross-section as shown in FIG. 3 may be made equal to that of the YIG sphere setting in the groove or nearly so for a mechanical fit, for good thermal contact between the YIG sphere and the wall of groove 24.

Figure 5B:
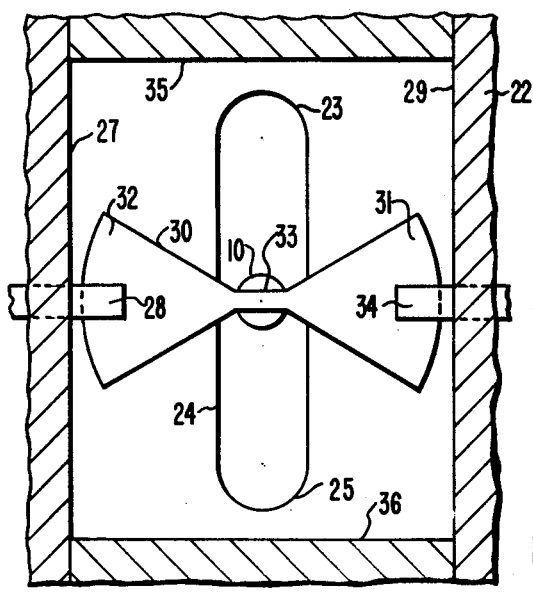
FIG. 5B is a cross-section view of FIG. 5A along the lines VB—VB.
Figure 5A:
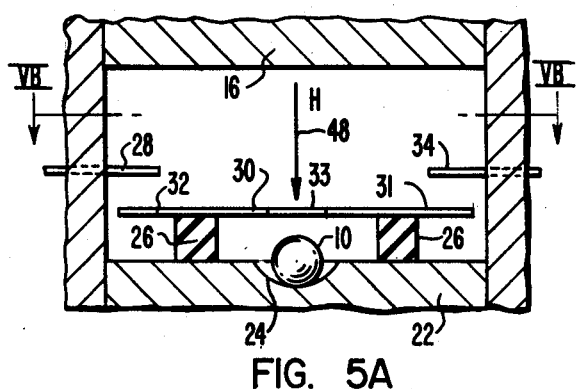
FIG. 5A is a cross-section view of an alternate embodiment of the invention.

FIG. 5A is a cross-section view of an alternate embodiment of the invention. FIG. 5B is a cross-section view of FIG. 5A along the lines VB—VB. In FIGS. 5A and 5B like references are used for functions corresponding to the apparatus of FIGS. 3 and 4. In FIGS. 5A and 5B an input signal is coupled to transmission line 28 which is spaced apart from transmission line 30, but which permits coupling of the RF energy on transmission line 28 to transmission resonator 30. Transmission line resonator 30 functions as a high Q resonator which may, for example, be a pseudo-radial resonator shown in FIG. 5B with flared ends 31 and 32. Capacitor effects are concentrated near the flared ends 31 and 32 while inductive effects are concentrated in the narrow center region 33 of pseudo-radial resonator 30. Resonance occurs when the overall length L is on the order of one-half wavelength. YIG sphere 10 is positioned in groove 24 of ground plane 22 and underneath transmission line resonator 30. If the transmission line resonator 30 is a pseudo-radial resonator as shown in FIG. 5B, then the narrow center region 33 is placed over YIG sphere 10 to place the YIG sphere in a region of high RF magnetic field. An output signal from transmission line resonator 30 is coupled to transmission line 34 by a spaced apart gap with some overlap as shown in FIGS. 5A and 5B. Transmission line resonator 30 is spaced and supported by spacers 26. Transmission lines 28 and 34 are supported by end walls 27 and 29, respectively, and are insulated therefrom (not shown) such as by an insulating bushing. Ground planes 16 and 22, end walls 27 and 29, and side walls 35 and 36 form an enclosed metal box or housing which is not essential to the operation of the invention. Groove 24 extends on either side of sphere 10 for a predetermined distance to minimize the effects of the currents in the ground plane at the groove ends 23 and 25.

Figure 6:
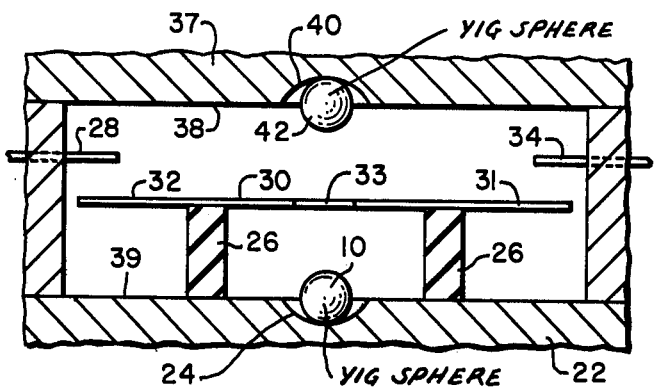
FIG. 6 is a cross-section view of an alternate embodiment of the invention.

FIG. 6 is a cross-section view of an alternate embodiment of the invention. In FIG. 6 like references are used for functions corresponding to the apparatus of FIGS. 5A and 5B. In FIG. 6 a first ground plane 22 is spaced apart from a second ground plane 37 each having a first surface 38 and 39 facing one another. A groove 24 is located in first surface 39 and a groove 40 is located in first surface 38 and positioned opposite groove 24. A first YIG sphere 10 is positioned in groove 24 and a second YIG sphere 42 is positioned in groove 40. A transmission line such as a transmission line resonator 30 is positioned between ground planes 22 and 37 and in between first and second YIG spheres 10 and 42. A means for supporting and spacing transmission line resonator 30 between ground planes 22 and 37 is provided by spacers 26. Transmission lines 28 and 34 provide a means for coupling RF signals in and out from transmission line resonator 30. Transmission line resonator 30, groove 24 and YIG sphere 10 have a top view as shown in FIG. 5B. The YIG spheres 10 and 42 may, for example, be 0.127 centimeters in diameter. Test results from the two-sphere limiter shown in FIG. 6 show that the power limiter had approximately 2.5 dB greater dynamic range than that obtained with a single sphere limiter. Theoretically, the increase in dynamic range should be 3 dB. The second YIG sphere 42 provides increased coupling to the transmission line resonator 30.

Figure 7:
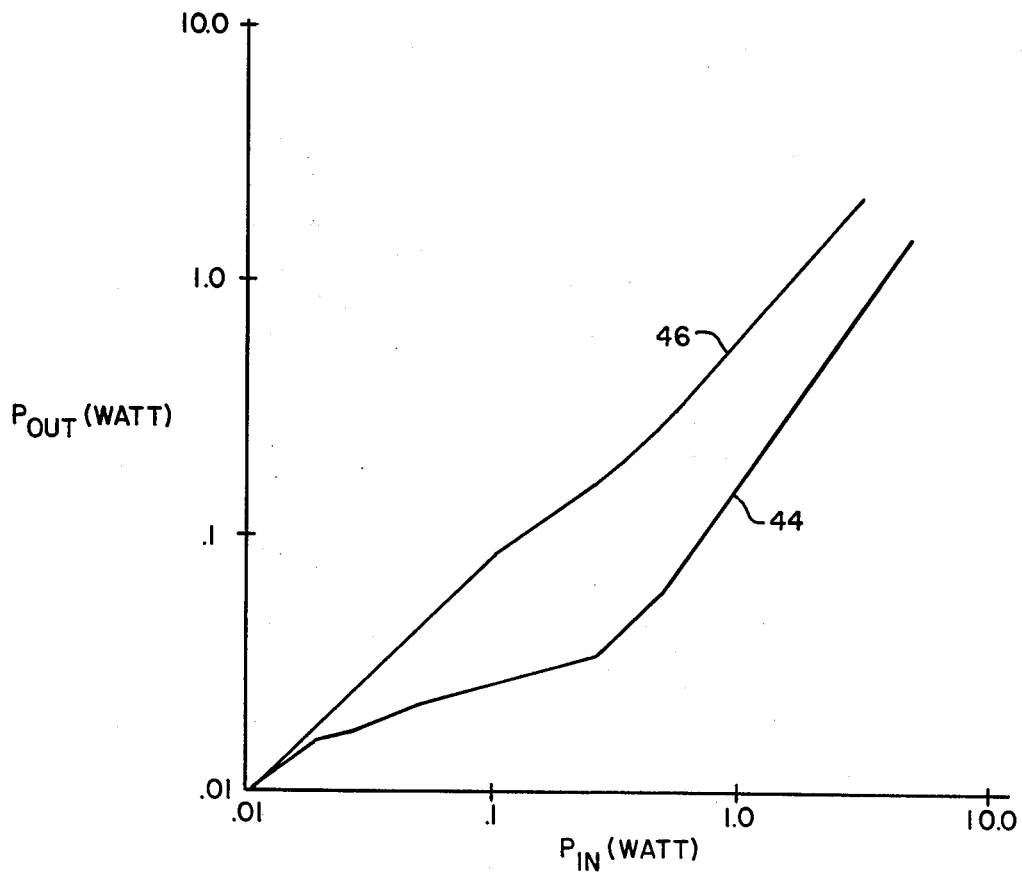
FIG. 7 is a graph showing CW power limiting for the embodiment of the invention of FIGS. 5A and 5B as a function of input power.

FIG. 7 is a graph showing CW power limiting as a function of input power for the embodiment of the invention shown in FIGS. 5A and 5B. In FIG. 7 the ordinate represents power out ($P_{out}$) in watts and the abscissa represents power in ($P_{in}$) in watts. The ordinate and abscissa are in logged arithmetic scale. For the measurements made for curve 44 of FIG. 7, transmission line resonator 30 was spaced 0.0635 centimeters above ground plane 22 as shown in FIG. 5A. Groove 24 was formed by machining a semi-circular groove in ground plate 22 having a diameter of 0.132 centimeters. YIG sphere 10 was 0.127 centimeters in diameter and was held in the groove on the end of a beryllia rod (not shown) with its center level with the surface of ground plane 22. The presence of the groove 24 coupled additional inductance in series with the transmission line resonator 30 as expected, lowering the center frequency to about 9,000 MHz. The YIG sphere 10 was biased to subsidiary resonance by an externally applied H field of 2,100 oersteds shown by arrow 48 in FIG. 5A. The presence of the magnetized YIG sphere 10 pulled the resonant frequency up to approximately 9,300 MHz. The CW limiting with this configuration as shown in FIGS. 5A and 5B is shown by curve 44 in FIG. 7.

In contrast, a conventional limiter such as shown in FIG. 1 with a pseudo-radial resonator 30 used in place of transmission line 14 was spaced 0.127 centimeters above a flat ground plane with a 0.127 centimeter diameter YIG sphere biased to subsidiary resonance. The YIG sphere was placed under the center section of the pseudo-radial resonator. Limiting data was obtained at approximately 9,300 MHz which is shown by curve 46 in FIG. 7.

Curve 44 shows that the limiting threshold is nearly 10 dB lower than the limiting threshold of curve 46 and that the dynamic range has increased approximately 6 dB for curve 44 compared to curve 46. For a center frequency of 9,300 MHz the 3 dB bandwidth for the limiter shown in FIGS. 5A and 5B for the measurements of curve 44 was 300 MHz.

The invention provides a method and apparatus for enhancing the magnetic coupling between a transmission line comprising a conductor and ground plane in a YIG sphere comprising the steps of: forming a groove in the ground plane, positioning the YIG sphere in the groove, and positioning the conductor over the ground plane and YIG sphere at a predetermined spacing.

The invention further provides apparatus for enhancing the magnetic coupling between a transmission line and a YIG sphere comprising a ground plane having a groove, the YIG sphere positioned in the groove of the ground plane, the transmission line positioned over the ground plane and YIG sphere and means for supporting and spacing the transmission line from the ground plane in the YIG sphere.

The invention further provides apparatus for enhancing the magnetic coupling between a transmission line and first and second YIG spheres comprising: first and second spaced apart ground planes each having a first surface facing one another having a groove in each first surface positioned opposite one another, the first YIG sphere positioned in the groove of the first ground plane, the second YIG sphere positioned in the groove of the second ground plane, the transmission line positioned between the first and second ground planes and in between the first and second YIG spheres, and means for supporting and spacing the transmission line between the first and second ground planes.

We claim:

1. Apparatus for enhancing the magnetic coupling between a transmission line and YIG sphere comprising:
   a ground plane having a groove transverse to said transmission line;
   said YIG sphere positioned in said groove of said ground plane to provide magnetic coupling between said ground plane and said sphere;
   said transmission line positioned over said ground plane and YIG sphere;
   means for supporting and spacing said transmission line from said ground plane and said YIG sphere; and
   wherein said groove extends on both sides of said sphere for a predetermined distance to minimize the effects of currents in the ground plane at the groove ends.

2. The apparatus of claim 1 wherein said ground plane is a metal plate.

3. The apparatus of claim 1 wherein said transmission line is a transmission line resonator.

4. The apparatus of claim 1 wherein said transmission line is a pseudo-radial resonator.

5. The apparatus of claim 1 including means for applying a static magnetic bias field to said YIG sphere.

6. Apparatus for enhancing the magnetic coupling between a transmission line and YIG sphere comprising:
   a ground plane having a groove orthogonal to said transmission line;
   said YIG sphere positioned in said groove of said ground plane to provide magnetic coupling between said ground plane and said sphere;
   said transmission line positioned over said ground plane and YIG sphere; and
   means for supporting and spacing said transmission line from said ground plane and said YIG sphere.

7. Apparatus for enhancing the magnetic coupling between a transmission line and YIG sphere comprising:
   a ground plane having a groove;
   said YIG sphere positioned in said groove of said ground plane to provide magnetic coupling between said ground plane and said sphere;
   said transmission line positioned over said ground plane and YIG sphere;
   means for supporting and spacing said transmission line from said ground plane and said YIG sphere; and
   wherein the cross-section shape of said groove is round having a radius equal to the radius of said sphere.

8. Apparatus for enhancing the magnetic coupling between a transmission line and YIG sphere comprising:
   a ground plane having a groove wherein the depth of said groove exceeds the radius of said YIG sphere;
   said YIG sphere positioned in said groove of said ground plane to provide magnetic coupling between said ground plane and said sphere;
   said transmission line positioned over said ground plane and YIG sphere; and
   means for supporting and spacing said transmission line from said ground plane and said YIG sphere.

9. Apparatus for enhancing the magnetic coupling between a transmission line and first and second YIG spheres comprising:
   first and second spaced apart ground planes each having a first surface facing one another and having a groove in each of said first surfaces positioned opposite one another and transverse to said transmission line;
   said first YIG sphere positioned in said groove of said first ground plane to provide magnetic coupling between said ground plane and said first sphere;
   said second YIG sphere positioned in said groove of said second ground plane to provide magnetic coupling between said ground plane and said second sphere;
   said transmission line positioned between said first and second ground planes and in between said first and second YIG spheres; and
   means for supporting and spacing said transmission line between said first and second ground planes.

10. The apparatus of claim 9 wherein said transmission line is a transmission line resonator.

11. The apparatus of claim 9 wherein said transmission line is a pseudo-radial resonator.

12. The apparatus of claim 9 including means for applying a static magnetic bias field to said YIG sphere.

13. Apparatus for enhancing the magnetic coupling between a transmission line and first and second YIG spheres comprising:
   first and second spaced apart ground planes each having a first surface facing one another and having a groove in each of said first surfaces positioned opposite one another and orthogonal to said transmission line;
   said first YIG sphere positioned in said groove of said first ground plane to provide magnetic coupling between said ground plane and said first sphere;
   said second YIG sphere positioned in said groove of said second ground plane to provide magnetic coupling between said ground plane and said second sphere;
   said transmission line positioned between said first and second ground planes and in between said first and second YIG spheres; and
   means for supporting and spacing said transmission line between said first and second ground planes.

14. Apparatus for enhancing the magnetic coupling between a transmission line and first and second YIG spheres comprising:
   first and second spaced apart ground planes each having a first surface facing one another and having a groove in each of said first surfaces positioned opposite one another;

said first YIG sphere positioned in said groove of said first ground plane to provide magnetic coupling between said ground plane and said first sphere;

said second YIG sphere positioned in said groove of said second ground plane to provide magnetic coupling between said ground plane and said second sphere;

said transmission line positioned between said first and second ground planes and in between said first and second YIG spheres;

means for supporting and spacing said transmission line between said first and second ground planes; and wherein the depth of said grooves exceeds the radius of said YIG spheres positioned therein.

15. A method for enhancing the magnetic coupling between a transmission line having a conductor and ground plane and a YIG sphere comprising the steps of:

forming a groove having a length greater than its width in said ground plane;

positioning said YIG sphere in said groove and spaced from its ends to provide magnetic coupling between said ground plane and said YIG sphere and to minimize the effects of currents in the ground plane at the groove ends; and positioning said conductor over said ground plane transverse to said groove and over said YIG sphere at a predetermined spacing.

16. The method of claim 15 wherein said step of forming a groove includes forming a groove with a circular cross-section at its bottom.

* * * * *